United States Patent
Hellberg et al.

(10) Patent No.: US 7,279,971 B2
(45) Date of Patent: Oct. 9, 2007

(54) COMPOSITE POWER AMPLIFIER

(75) Inventors: Richard Hellberg, Huddinge (SE); Mats Klingberg, Enskede (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 182 days.

(21) Appl. No.: 10/525,957

(22) PCT Filed: Sep. 6, 2002

(86) PCT No.: PCT/SE02/01605

§ 371 (c)(1), (2), (4) Date: Feb. 28, 2005

(87) PCT Pub. No.: WO2004/023647

PCT Pub. Date: Mar. 18, 2004

(65) Prior Publication Data

US 2005/0248401 A1    Nov. 10, 2005

(51) Int. Cl.
*H03F 3/68* (2006.01)

(52) U.S. Cl. .................. 330/124 R; 330/295
(58) Field of Classification Search ............ 330/124 R, 330/295, 84, 126
See application file for complete search history.

(56) References Cited

U.S. PATENT DOCUMENTS

| 4,584,197 | A | 4/1986 | Takasaki et al. |
| 5,012,200 | A | 4/1991 | Meinzer |
| 5,732,325 | A | 3/1998 | Dent et al. |
| 5,786,727 | A * | 7/1998 | Sigmon .................. 330/124 R |
| 6,251,865 | B1 | 6/2001 | Clark et al. |
| 6,700,444 | B2 * | 3/2004 | Pengelly .................. 330/295 |
| 7,064,606 | B2 * | 6/2006 | Louis .................... 330/124 R |

FOREIGN PATENT DOCUMENTS

| EP | 1 112 693 | 7/2001 |
| EP | 1 172 373 | 1/2002 |
| GB | 2 359 206 A | 8/2001 |
| GB | 2 381 451 | 5/2003 |
| WO | 93/10147 | 5/1993 |
| WO | 98/02165 | 1/1998 |
| WO | 98/48640 | 11/1998 |
| WO | 99/38501 | 8/1999 |
| WO | 00/77034 | 12/2000 |
| WO | 01/19542 | 3/2001 |
| WO | 01/37850 | 5/2001 |

(Continued)

OTHER PUBLICATIONS

Luc JC Van Loon et al., Plasma insulin responses after ingestion of different amino acid or protein mixtures with carbohydrate[1-3], vol. 72, No. 1, Jul. 2000, pp. 96-105, XP-002230094.

(Continued)

*Primary Examiner*—Henry Choe
(74) *Attorney, Agent, or Firm*—Nixon & Vanderhye, P.C.

(57) ABSTRACT

A composite amplifier comprises several Chireix pairs (PA11, PA12; PA21, PA22) of power amplifiers connected to a common load. Means (21) are provided for driving each Chireix pair by drive signals having amplitude dependent phase over at least a part of the dynamic range of the composite amplifier. These parts are preferably different for different pairs.

23 Claims, 9 Drawing Sheets

FOREIGN PATENT DOCUMENTS

| | | |
|---|---|---|
| WO | 01/68114 | 9/2001 |
| WO | 0191282 A2 | 11/2001 |
| WO | 02/32232 | 4/2002 |
| WO | 02/45523 | 6/2002 |

OTHER PUBLICATIONS

DATABASE WPI XP-002242190 & JP 05 344863, (Meiji Milk Prod Co Ltd), Dec. 27, 1993.
International Search Report.

* cited by examiner

COMPOSITE POWER AMPLIFIER

CROSS-REFERENCE TO RELATED APPLICATIONS

This application is a 371 of PCT/SE02/01605 filed Sep. 6, 2002

TECHNICAL FIELD

The present invention relates to an improved composite amplifier and a method of driving such an amplifier.

BACKGROUND

In radio transmitters for broadcast, cellular, and satellite systems, the power amplifier (PA) in the transmitter has to be very linear, in addition to being able to simultaneously amplify many radio channels (frequencies) or independent user data channels, spread across a fairly wide bandwidth. It also has to do this efficiently, to reduce power consumption, need for cooling, and to increase its longevity. High linearity is required since nonlinear amplifiers would cause leakage of interfering signal energy between channels and distortion within each channel.

The amplitude probability density of a mix of sufficiently many independent radio frequency (RF) channels, or of a multi-user CDMA (Code Division Multiple Access) signal, tends to be close to a Rayleigh distribution having a large peak-to-average power ratio. Since a conventional linear radio frequency power amplifier generally has an efficiency proportional to its output amplitude, its average efficiency is very low for such signals.

In response to the low efficiency of conventional linear power amplifiers for wide bandwidth signals with large peak-to-average power ratio, the Chireix outphasing method [1] has been suggested. The term "outphasing", which is the key method in Chireix and LINC amplifiers (LINC=Linear Amplification using Nonlinear Components), generally means the method of obtaining amplitude modulation by combining phase-modulated constant-amplitude signals from two transistors.

Furthermore, a three-transistor amplifier (or more generally an odd number of transistors) using the outphasing principle is described in [2].

There is often a need for higher efficiency than what is obtainable with two-amplifier Chireix amplifiers. The maximum efficiency for these amplifiers is limited to a certain value, which depends on the signal amplitude distribution. Adding more amplifiers to the Chireix amplifier, as suggested in [2], has so far been unsuccessful in increasing the efficiency. In fact, the amplifier described in [2] is less efficient than a conventional Chireix amplifier with modified drive signals, as described in [6].

SUMMARY

An object of the present invention is to provide efficient multi-stage composite power amplifiers based at least partially on the outphasing concept of the Chireix amplifier.

Briefly, the present invention provides power amplifiers in pairs and drives each pair of power amplifiers by drive signals having amplitude dependent phase over at least a part of the dynamic range of the composite amplifier. Preferably different pairs have amplitude dependent phase in different parts of the dynamic range to maximize efficiency.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description the same reference designations will be used for the same or similar elements throughout the figures of the drawings.

Figure 1:
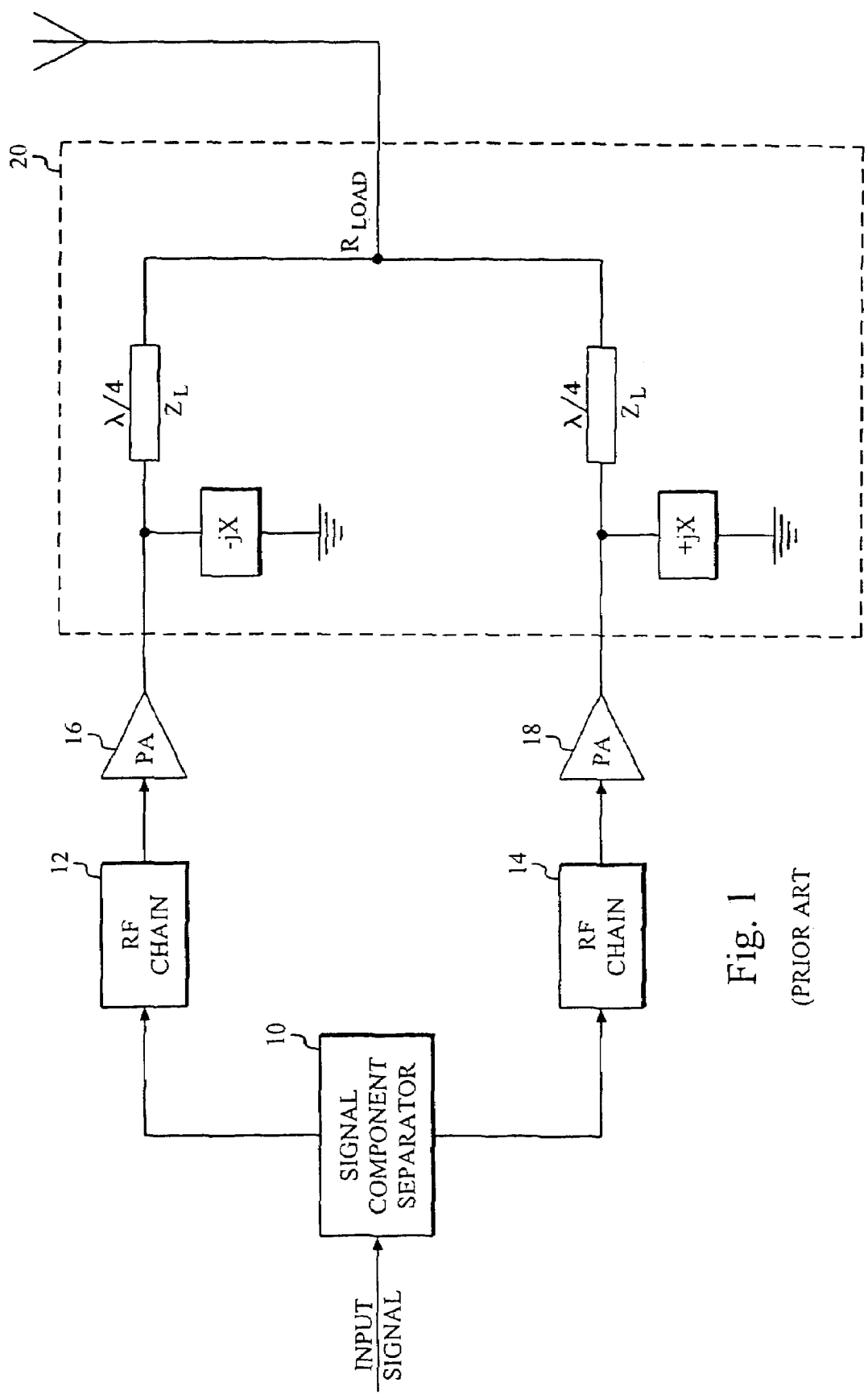
FIG. 1 is a block diagram of a typical prior art Chireix amplifier.

FIG. 1 is a block diagram of a typical prior art Chireix amplifier, which uses saturated amplifiers to obtain constant-amplitude voltages. The term "outphasing", which is the key method in Chireix and LINC amplifiers, generally means the method of obtaining amplitude modulation by combining two phase-modulated constant-amplitude voltages produced in a signal component separator 10. After up-conversion and amplification through RF chains 12, 14 (mixers, filters, amplifiers) and power amplifiers 16, 18, the outphased voltages are combined to form an amplified linear voltage in a Chireix type output network 20. The phases of these constant-amplitude outphased voltages are chosen so that the result from their vector-summation yields the desired amplitude. Output network 20 includes two quarter-wave lines $\lambda/4$ (where $\lambda$ denotes the wavelength of the center frequency of the Chireix amplifier) and two compensating reactances $+jX$ and $-jX$, which are used to extend the region of high efficiency to include lower output power levels. The efficiency of Chireix systems is analyzed in [3, 4].

An advantage of the Chireix amplifier is the ability to change the efficiency curve to suit different peak-to-average power ratios, by changing the size (X) of the reactances. The peak output power is equally divided between the amplifiers irrespective of this adjustment, which means that equal size (capacity) amplifiers can be used. Changing the size of the reactances is the only way of increasing the efficiency of conventional Chireix amplifiers. The maximum efficiency is therefore limited to a certain value, depending on the signal amplitude distribution.

Figure 2:
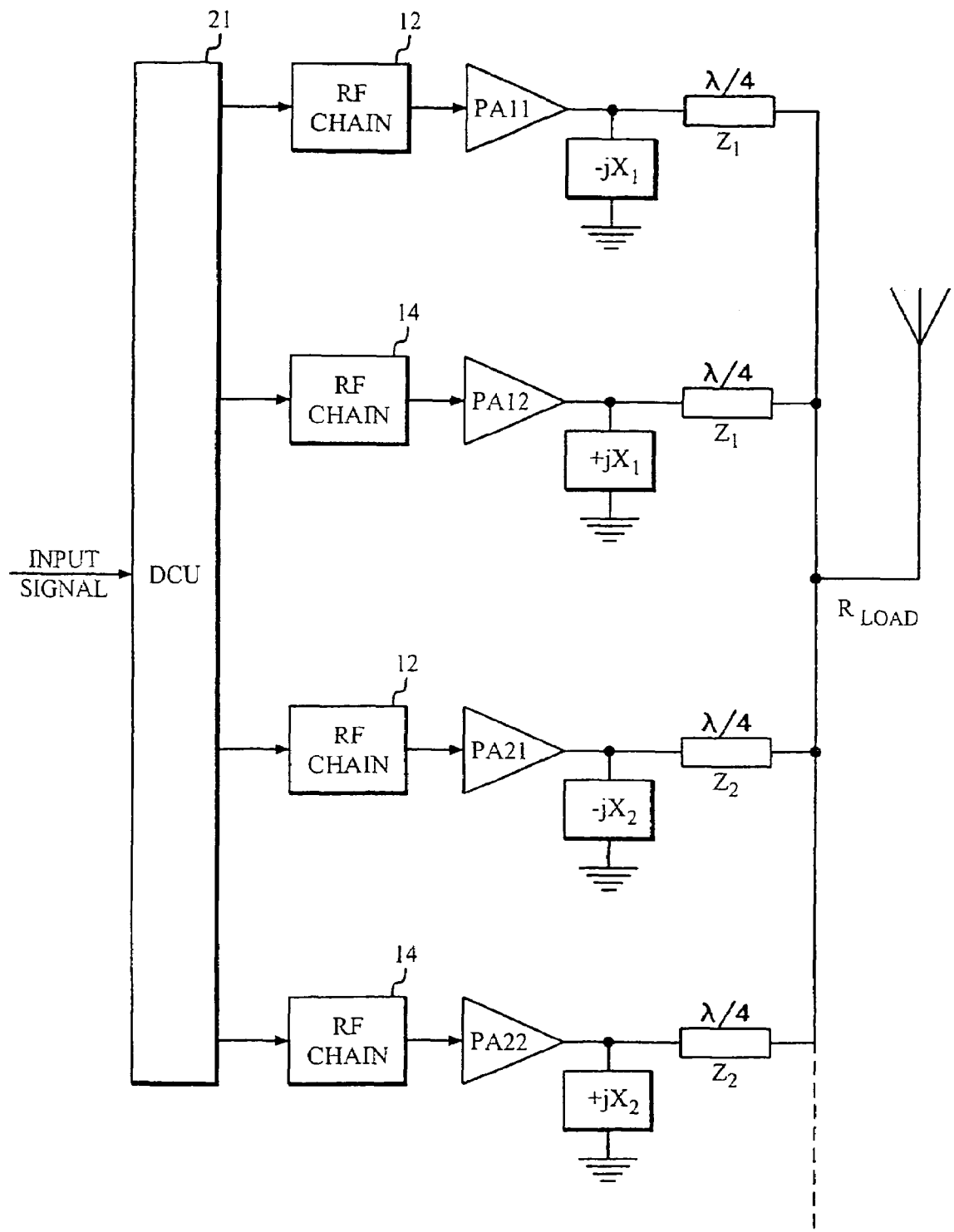
FIG. 2 is a block diagram of an exemplary embodiment of a composite power amplifier.

FIG. 2 is a block diagram of an exemplary embodiment of a composite power amplifier in accordance with the present invention. The composite amplifier comprises a number of "Chireix pairs" P11, P12 and P21, P22 with associated output networks (further pairs can also be used, as indicated by the dashed lines) controlled by a drive control unit 21. Drive control unit 21 preferably drives the amplifiers in such a way that the different "Chireix pairs" can work in an outphasing mode in different parts of the dynamic range of the composite amplifier. The outphasing mode is characterized by substantially constant voltage, and varying relative phase, at the output nodes of the transistors of the Chireix pair. The boundaries between these parts are determined by the relative maximum output power of the Chireix pairs, and by the choice of which pair should operate in the outphasing mode in which region.

As an example, if one pair provides 40% and the other pair provides 60% of the maximum available output power, the boundary can be either at 0.4 or at 0.6 times the maximum output voltage. The lower value is for the case when the "smaller" pair is operating in outphasing mode below the boundary, and the larger value is for the case when the "larger" pair is operating in outphasing mode below the boundary.

As another example, if there are three pairs, there will be two boundaries. The first of these depends only on the maximum output power of the Chireix pair chosen to operate in outphasing mode below this boundary. The second boundary depends on the summed power of the first pair and the pair chosen to operate in outphasing mode in the next output voltage region. This is easily generalized to an arbitrary number of constituent Chireix pairs.

If no other impedance transformation is performed in the output network, the transmission line impedances Z should be substantially equal to the optimal load of each constituent amplifier. The transformed antenna impedance $R_{LOAD}$ should then equal the parallel connection of the optimal loads of all amplifiers.

The values of the various reactances $X_i$ are chosen so that they compensate for possible reactive currents at the amplifiers within the region where a corresponding pair is operating in outphasing mode. This usually means that the reactances should be increased (compared to those optimal for a regular Chireix amplifier) for the Chireix pairs that operate in outphasing mode in low regions of output voltage, and be decreased for pairs that operate in outphasing mode at high output voltage levels.

Figure 3:
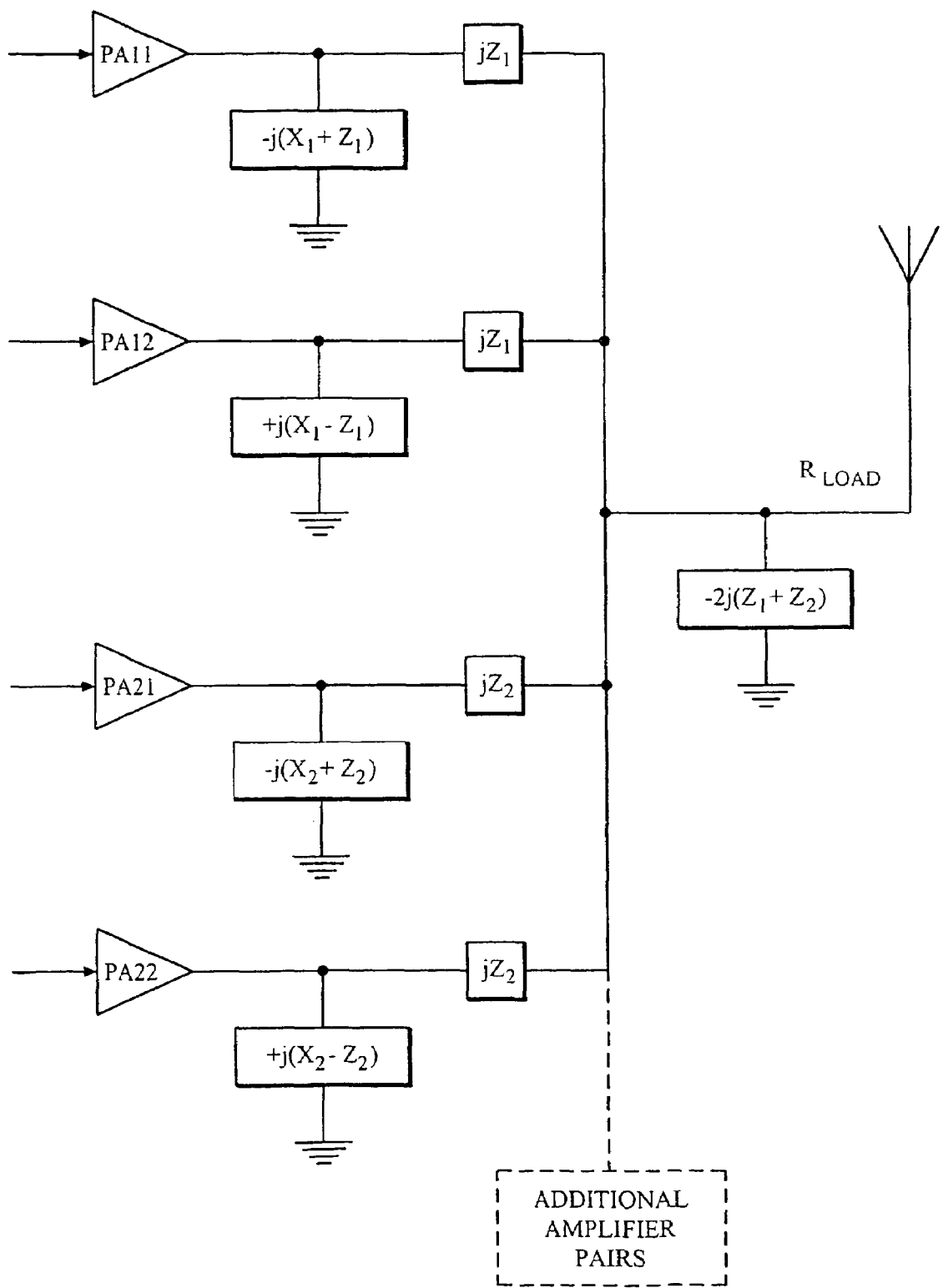
FIG. 3 is a block diagram of an exemplary embodiment of an output network of a composite power amplifier.
Figure 4:
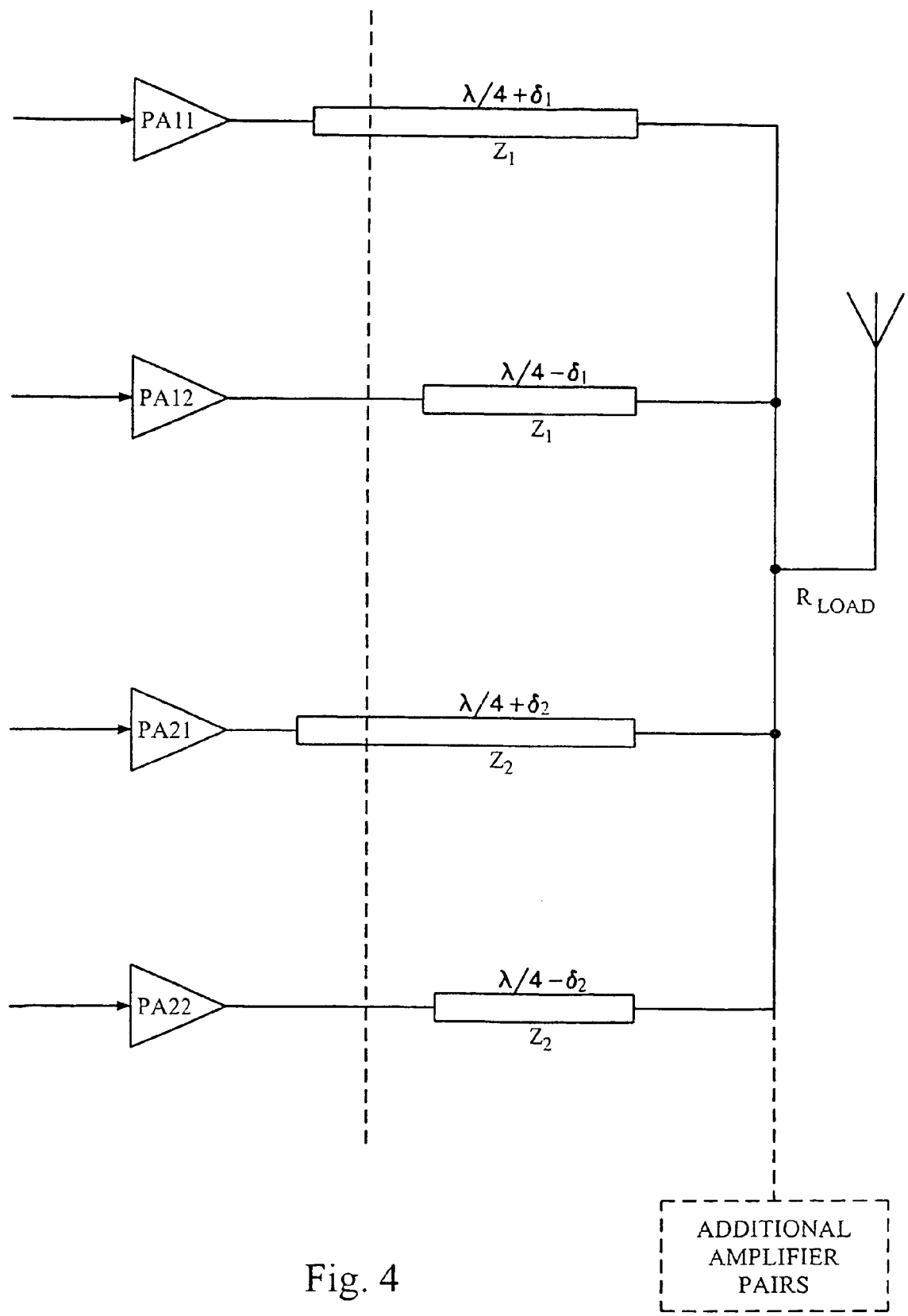
FIG. 4 is a block diagram of another exemplary embodiment of an output network of a composite power amplifier.

Other ways of implementing the output networks of the Chireix pairs are by using only lumped elements, i.e. capacitors and inductors, as shown in FIG. 3, or by using transmission lines only (distributed implementation), as shown in FIG. 4.

In the lumped element implementation of FIG. 3, pi-sections or other lumped element networks replace the quarter-wavelength lines of FIG. 2. The reactances to ground from a certain node are then conveniently replaced with a single reactance having the equivalent parallel-connection value.

In the distributed implementation of FIG. 4, the reactance+quarter wave combination of FIG. 2 are replaced by shortened and lengthened transmission lines.

Many more implementations are of course possible. For example, the quarter-wave lines (or their equivalent circuits) can be used for transforming between the load and the transistors. More impedance-matching sections can also be added in each branch, and a host of other circuit transformation techniques are also available for a person skilled in the art.

As noted above, each constituent Chireix pair preferably has a region where the "outphasing mode" represents optimal operation. At output voltages below this region, the pair in question should either not be driven at all (having zero output currents from the transistors), or be driven in a linear fashion, for example as described in [6]. At output voltages above this region, the drive (and therefore the output current) is increased substantially linearly, with adjustments to the phase angle to keep the Chireix pair at maximum efficiency.

The lowest pair starts optimally with a region of linear operation, until the output node voltages of its transistors reach the maximum allowed. At this point the "outphasing" (constant voltage, varying phase, through currents with amplitude dependent phase) operation takes over, and continues until the first pair cannot single-handedly (and economically) provide the required rise in output voltage by operating in outphasing mode.

The second Chireix pair, which until now has been inactive (i.e. zero output current), starts to increase its output current linearly, until its output node voltages reach the maximum allowed. It then starts to operate in the outphasing mode, until it, together with the first pair, cannot provide the required rise in the output voltage. During these two regions of operation, the first pair has increased its output current substantially linearly.

The operation of higher Chireix pairs, and the continued operation of the lower pairs, follow the same pattern. At output voltages below the voltage where the outphasing region of the next lower pair ends, the higher Chireix pair is inactive (i.e. zero output current). It then has a region of linear operation, until it reaches the maximum output node voltage of its transistors. Outphasing (amplitude dependent phase) operation is used next, and at even higher output voltages it provides mainly a linear rise in its output currents, when the higher pair has started to be active.

The boundaries between the different regions are in practice not as distinct as described here. There can be a small overlap, so that the previous stage is not entirely past its outphasing region when the next stage starts to operate. The decrease in efficiency that comes from using distinct boundaries is usually negligible.

Furthermore, the regions of linear operation just below the outphasing regions are not strictly necessary, and can be replaced with a downward extension of the outphasing region, if the corresponding loss in efficiency is acceptable. All amplifiers can also, in principle, be operating in outphasing mode all the time, but this is less efficient.

To illustrate the details of multi-stage Chireix network design and operation, we can use the two-stage Chireix amplifier in FIG. 2 as an example. This exemplary system consists of 4 amplifiers with output power capability per "Chireix pair" of 0.4 (pair P11, P12) and 0.6 (pair P21. P22) of the total maximum output power, respectively. The Chireix pair P11, P12 with the lower output capability is operating by itself in the outphasing mode in part of the lower region, and the other pair outphases in the higher region. The amplifier output network is implemented with transmission lines, according to FIG. 4. The line length differences (to a quarter wavelength) are: $\delta_1=0.025\lambda$ and $\delta_2=0.09\lambda$.

Figure 5:
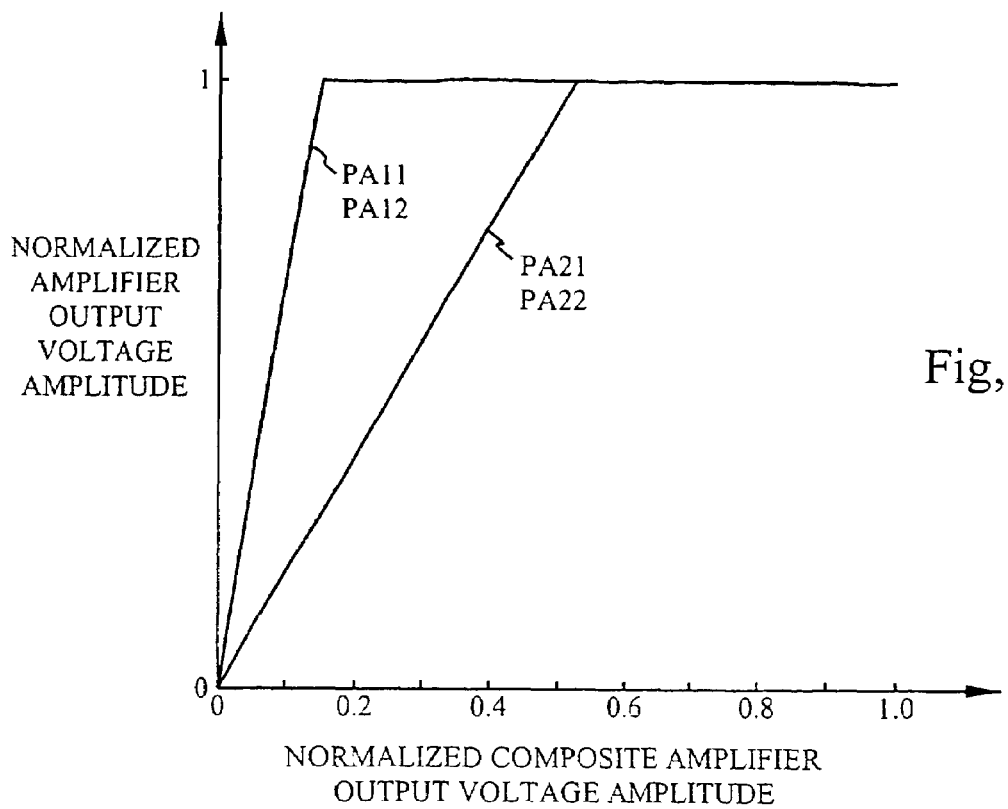
FIG. 5 is a diagram illustrating the dependence of the normalized output voltage amplitude of each amplifier on the normalized output voltage amplitude of a composite amplifier having two Chireix pairs.
Figure 6:
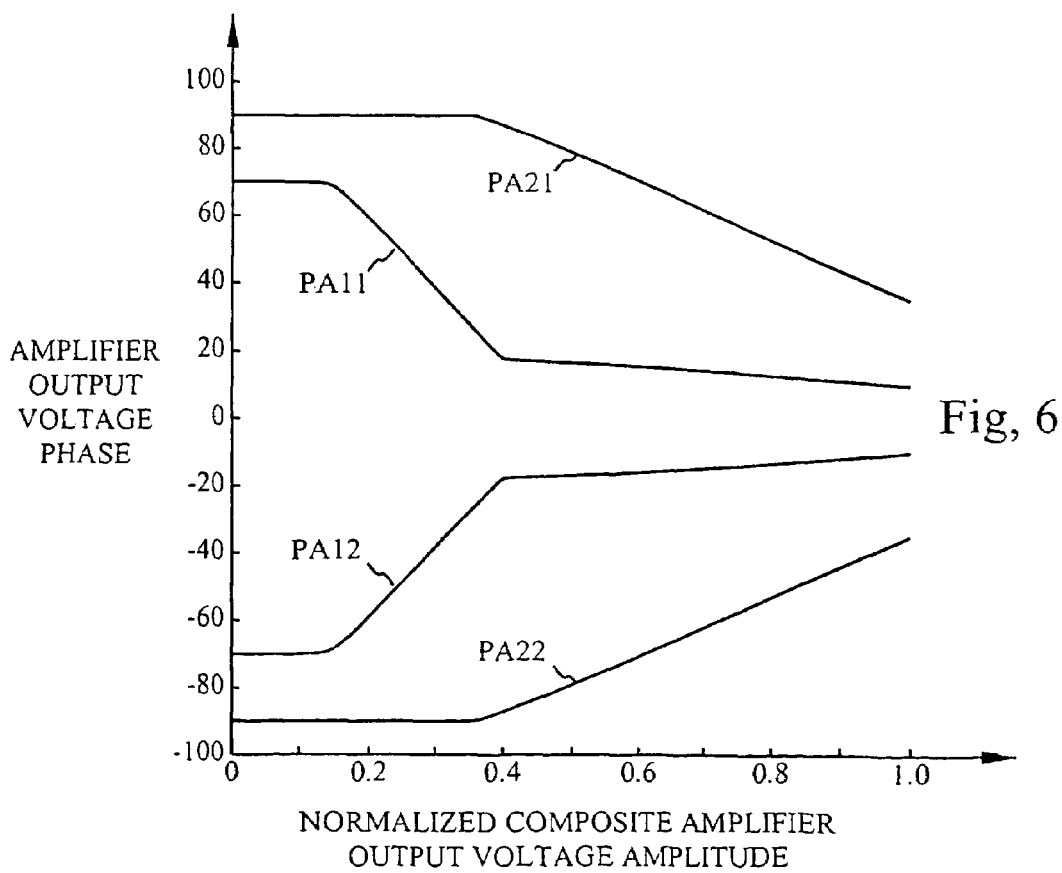
FIG. 6 is a diagram illustrating the dependence of the output voltage phase of each amplifier on the normalized output voltage amplitude of a composite amplifier having two Chireix pairs.
Figure 7:
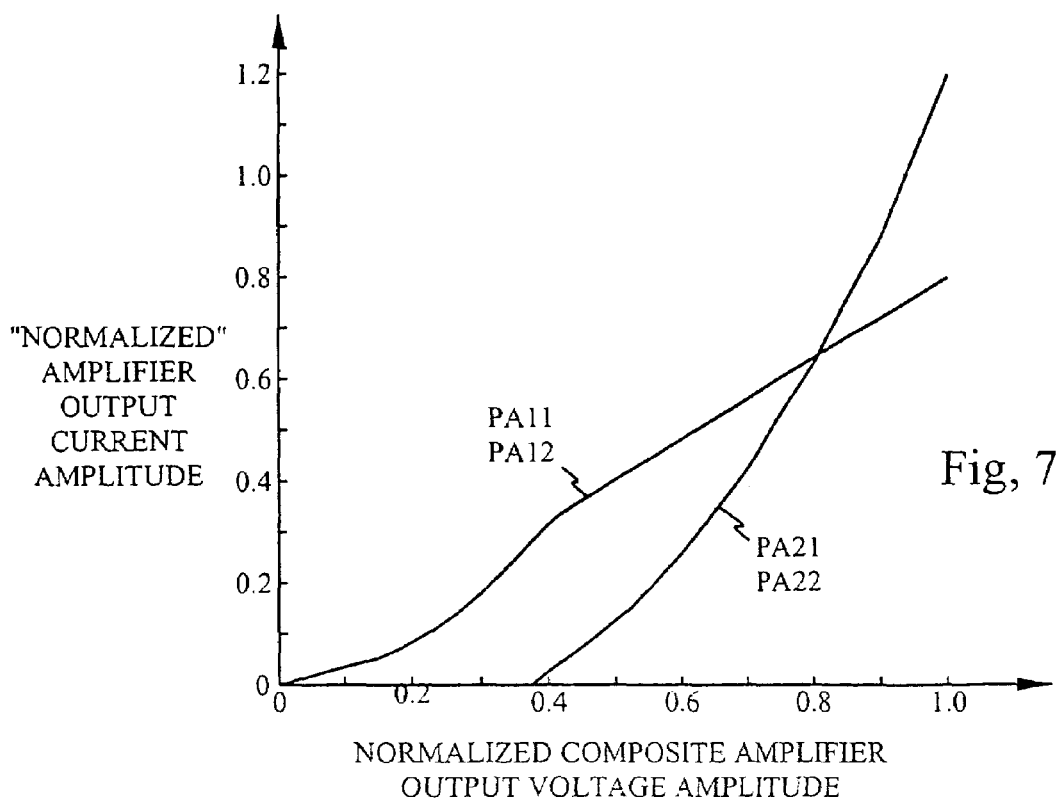
FIG. 7 is a diagram illustrating the dependence of the normalized output current amplitude of each amplifier on the normalized output voltage amplitude of a composite amplifier having two Chireix pairs.
Figure 8:
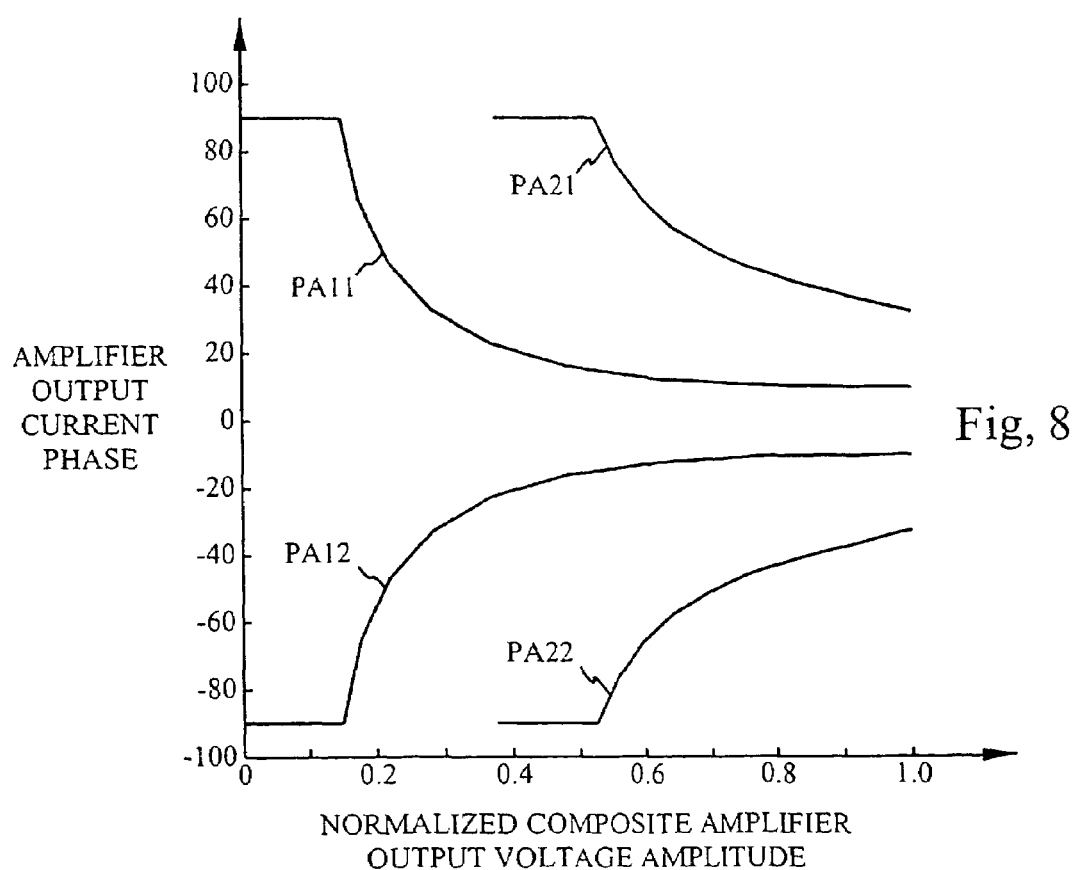
FIG. 8 is a diagram illustrating the dependence of the output current phase of each amplifier on the normalized output voltage amplitude of a composite amplifier having two Chireix pairs.

The amplitudes and phases of the voltages at the amplifier output nodes are shown in FIGS. 5 and 6, respectively, and the amplitudes and phases of the currents at the amplifier output nodes are shown in FIGS. 7 and 8, respectively. As previously stated, the first Chireix pair (consisting of PA11 and PA12) has a linear voltage increase with a constant phase difference at low output levels, later changing to constant voltage, outphasing operation in a middle region between 0.15 and 0.37 of maximum composite amplifier output voltage. The output voltage of the second Chireix pair (consisting of PA21 and PA22) also increases linearly, with a 180-degree phase difference, at low levels. When the first outphasing region of the pair ends (at 0.37), the voltage still rises for the second pair, which now starts to deliver linear current. When the voltage reaches the maximum at 0.53, pure outphasing operation takes over, which for the second pair in this example lasts until maximum output voltage of the composite amplifier is reached. In this region, the first pair continues to deliver substantially linear current, as seen in FIG. 7 (the currents are "normalized" with respect to the average maximum current of the four amplifiers, i.e. the sum of all maximum currents is equal to 4).

Figure 9:
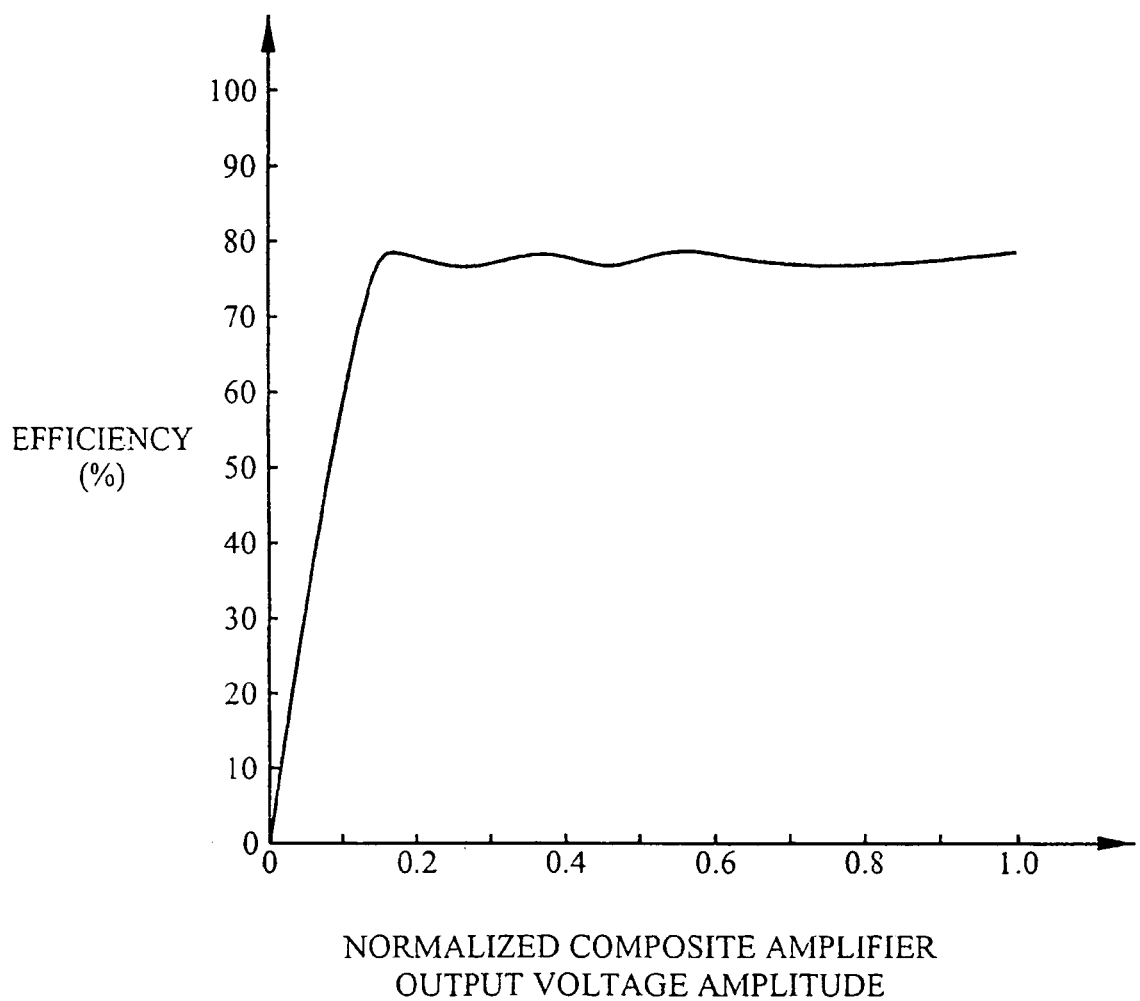
FIG. 9 is a diagram illustrating the efficiency as a function of the normalized output voltage of a composite amplifier having two Chireix pairs.

The phases of the output currents delivered by the respective amplifiers are shown in FIG. 8. The absence of a phase plot for the second Chireix pair at low output voltages indicates that this is of no interest, since the delivered current is zero anyway. In the linear drive regions below the outphasing regions for the Chireix pairs, the amplifier output currents have constant phase difference. Above the outphasing region, the phase difference needs to change, albeit less than in the outphasing region, to obtain optimal efficiency. The resulting efficiency for the two-stage Chireix system, assuming ideal linear transistors in class B operation, is shown in FIG. 9.

Figure 10:
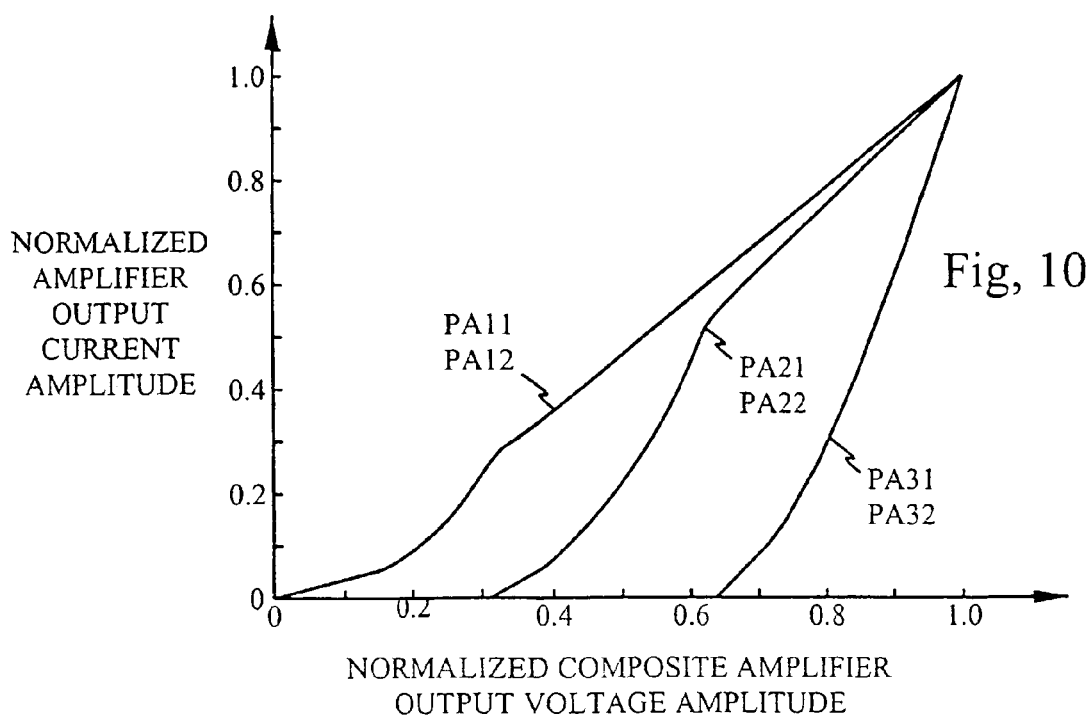
FIG. 10 is a diagram illustrating the dependence of the normalized output current amplitude of each amplifier on the normalized output voltage amplitude of a composite amplifier having three Chireix pairs.
Figure 11:
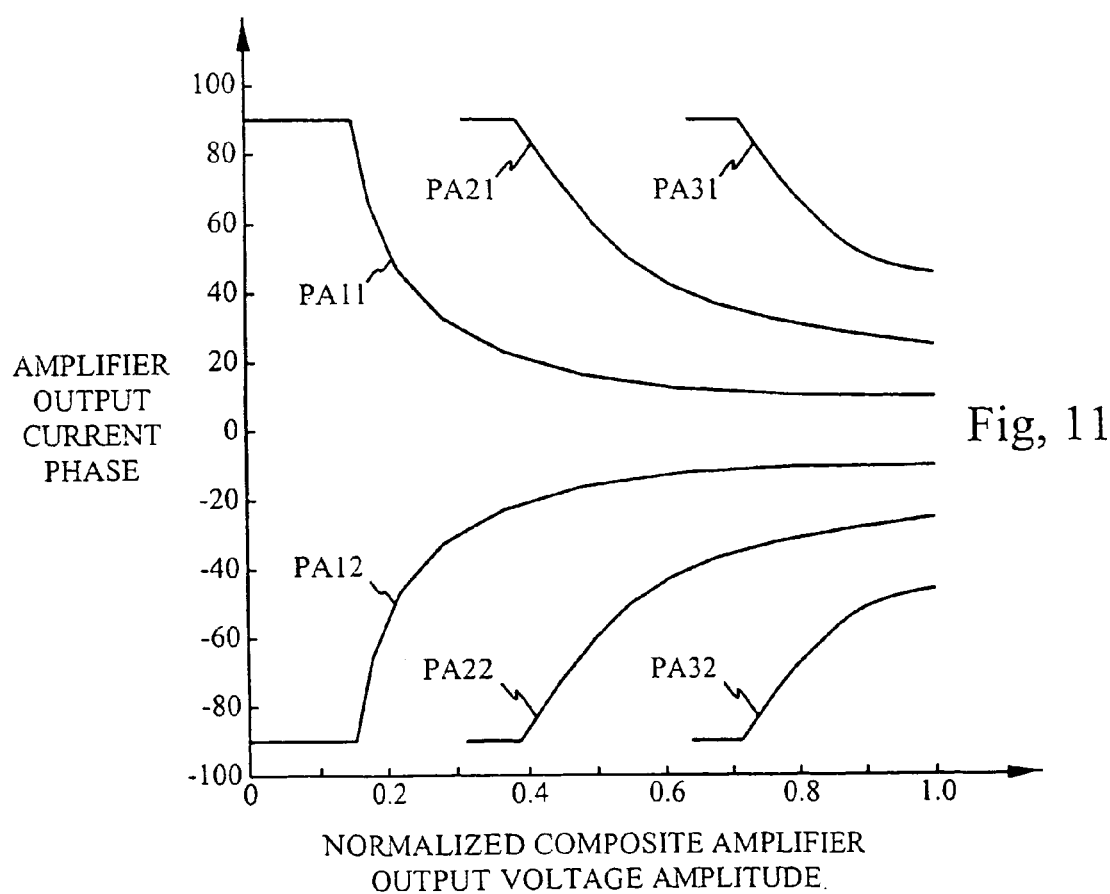
FIG. 11 is a diagram illustrating the dependence of the output current phase of each amplifier on the normalized output voltage amplitude of a composite amplifier having three Chireix pairs.
Figure 12:
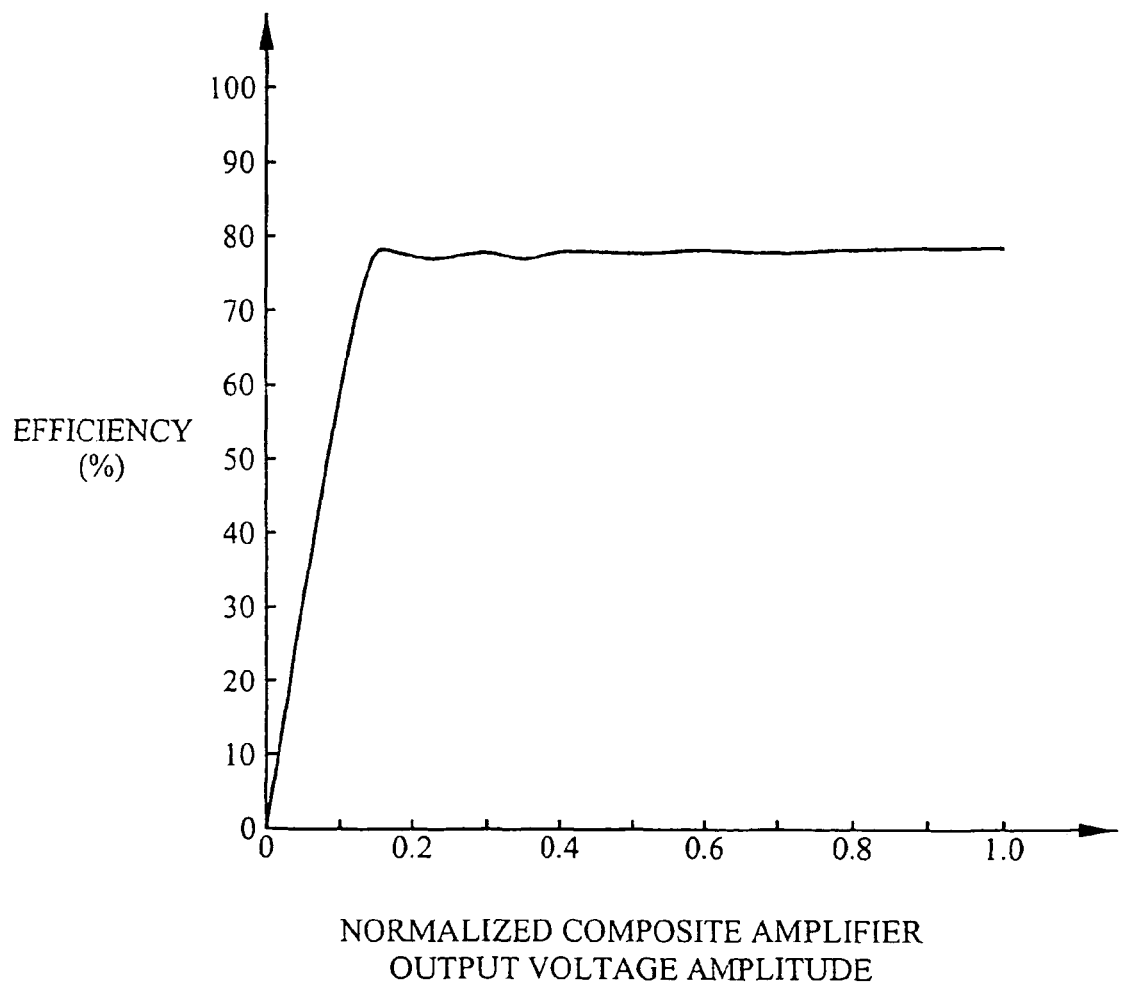
FIG. 12 is a diagram illustrating the efficiency as a function of the normalized output voltage of a composite amplifier having three Chireix pairs.

A three-stage Chireix amplifier operates substantially in the same way as the two-stage system discussed above. In this example, all transistor sizes (and therefore the transmission line impedances) are equal. The network consists of three pairs, with line lengths differing from a quarter wavelength by: $\delta_1=0.023\lambda$, $\delta_2=0.064\lambda$ and $\delta_3=0.132\lambda$. The amplitudes and phases of the constituent amplifier output currents are shown in FIGS. 10 and 11, respectively. The phase behavior of the currents is similar to that of the two-stage Chireix amplifier. The amplitude of the currents of the transistors of the first stage are clearly seen to have a first linear region at low output amplitudes (between 0 and 0.15 of the maximum output voltage), followed by an outphasing region (from 0.15 to 0.33), which is then followed by a second substantially linear region (above 0.33 of the maximum output voltage). Note that this second linear region continues in the linear and outphasing regions of both higher stages. The second stage output currents start with a linear region, which is followed by an outphasing region, which in turn is followed by a second, substantially linear region. The third stage has only one linear region, above which it is outphasing at all output levels up to the maximum. The efficiency of the exemplary three-stage Chireix amplifier, assuming linear transistors in class B operation, is shown in FIG. 12.

The described drive method is implemented in drive control unit 21 (FIG. 2). This unit may, for example, be implemented as a combination of a lookup table followed by D/A converters in which a digital input signal amplitude is transformed into the proper drive signals (the input signal amplitude is assumed to be proportional to the composite amplifier output voltage amplitude). However, analog implementations are also possible. Furthermore, the drive signals may also be formed anywhere in the RF chains.

As indicated by antennas, the composite amplifier may be part of a transmitter, for example a transmitter in a radio terminal, such as a base station or a mobile station in a cellular mobile radio communication system.

A composite amplifier in accordance with the present invention makes it possible to obtain significantly higher efficiency than with single-stage Chireix amplifiers. Furthermore, it is also possible to get higher efficiency than with multi-stage Doherty networks [5] with the same number of transistors. This is because the peaks in the efficiency curve are flat (rounded) rather than peaked (as in the Doherty case).

Another advantage is that more evenly sized (and possibly equal size) transistors can be used. This can be very useful, since often only a limited number of transistor sizes are available from the manufacturers.

The network structure is also fairly simple, and uses a much more limited range of transmission line impedances (in the case of equal size transistors only a single value is needed), than multi-stage Doherty networks.

It will be understood by those skilled in the art that various modifications and changes may be made to the present invention without departure from the scope thereof, which is defined by the appended claims.

REFERENCES

[1] H. Chireix, "High Power Outphasing Modulation", Proc. IRE, vol. 23, no. 2, pp. 1370-1392, November 1935.
[2] K. Meinzer, "Method and System for the Linear Amplification of Signals ", U.S. Pat. No. 5,012,200.
[3] F. H. Raab, "Efficiency of Outphasing RF Power Amplifier Systems", IEEE Trans. Communications, vol. Com-33, no. 10, pp. 1094-1099, October. 1985.
[4] B. Stengel and W. R. Eisenstadt, "LINC Power Amplifier Combiner Method Efficiency Optimization", IEEE Trans. Vehicular Technology, vol. 49, no. 1, pp. 229-234, January 2000.
[5] F. H. Raab, "Efficiency of Doherty RF Power Amplifier Systems", IEEE Trans. Broadcasting, vol. BC-33, no. 3, pp. 77-83, September 1987.
WO01/91282 A2

The invention claimed is:

1. A composite amplifier having a power amplifying stage comprising an even number of power amplifiers arranged into a plurality of Chireix pairs connected to a common load, further comprising
    means for driving at least one Chireix pair by drive signals having amplitude dependent phase over at least a part of the dynamic range of the composite amplifier; and
    means for driving at least two Chireix pairs in outphasing mode over different parts of the dynamic range of the composite amplifier.

2. The amplifier of claim 1, including means for driving each Chireix pair in outphasing mode over a different part of the dynamic range of the composite amplifier.

3. The amplifier of claim 1, wherein each Chireix pair includes an output network, at least two output networks being comprised by different compensating reactances.

4. The amplifier of claim 1, wherein each Chireix pair includes an output network, said output networks all being comprised by different compensating reactances.

5. The amplifier of claim 1, wherein each Chireix pair includes an output network formed by transmission lines of different length from each power amplifier in the pair to said common load, the length difference being different for at least two pairs.

6. The amplifier of claim 1, wherein each Chireix pair includes an output network formed by transmission lines of different length from each power amplifier in the pair to said common load, the length difference being different for all pairs.

7. The amplifier of claim 1, including means for driving at least one Chireix pair with substantially linear current amplitudes above its corresponding outphased part of the dynamic range of the composite amplifier.

8. The amplifier of claim 1, including means for driving at least one Chireix pair with substantially linear current amplitudes below its corresponding outphased part of the dynamic range of the composite amplifier.

9. A method of driving a composite amplifier including a plurality of Chireix pairs of power amplifiers connected to a common load, said method including driving at least one Chireix pair by drive signals having amplitude dependent phase over at least a part of the dynamic range of the composite amplifier.

10. A method of driving a composite amplifier including a plurality of Chireix pairs of power amplifiers connected to a common load, said method comprising
driving at least one Chireix pair by drive signals having amplitude dependent phase over at least a part of the dynamic range of the composite amplifier
driving at least two Chireix pairs in outphasing mode over different parts of the dynamic range of the composite amplifier.

11. The method of claim 10, further including driving each Chireix pair in outphasing mode over a different part of the dynamic range of the composite amplifier.

12. The method of claim 11, further including driving at least one Chireix pair with substantially linear current amplitudes above its corresponding outphased part of the dynamic range of the composite amplifier.

13. The method of claim 11, further including driving at least one Chireix pair with substantially linear current amplitudes below its corresponding outphased part of the dynamic range of the composite amplifier.

14. A radio terminal comprising a power amplifying stage comprising:
an even number of power amplifiers arranged into a plurality of Chireix pair connected to a common load;
means for driving at least one Chireix pair by drive signals having amplitude dependent phase over at least a part of the dynamic range of the composite amplifier;
means for driving at least two Chireix pairs in outphasing mode over different parts of the dynamic range of the composite amplifier.

15. The radio terminal of claim 14, including means for driving each Chireix pair in outphasing mode over a different part of the dynamic range of the composite amplifier.

16. The radio terminal of claim 14, wherein each Chireix pair includes an output network, at least two output networks being comprised by different compensating reactances.

17. The radio terminal of claim 14, wherein each Chireix pair includes an output network, said output networks all being comprised by different compensating reactances.

18. The radio terminal of claim 14, wherein each Chireix pair includes an output network formed by transmission lines of different length from each power amplifier in the pair to said common load, the length difference being different for at least two pairs.

19. The radio terminal of claim 14, wherein each Chireix pair includes an output network formed by transmission lines of different length from each power amplifier in the pair to said common load, the length difference being different for all pairs.

20. The radio terminal of claim 14, including means for driving at least one Chireix pair with substantially linear current amplitudes above its corresponding outphased part of the dynamic range of the composite amplifier.

21. The radio terminal of claim 14, including means for driving at least one Chireix pair with substantially linear current amplitudes below its corresponding outphased part of the dynamic range of the composite amplifier.

22. The radio terminal of claim 14, wherein said radio terminal is a mobile radio terminal.

23. The radio terminal of claim 14, wherein said radio terminal is a base station.

* * * * *

UNITED STATES PATENT AND TRADEMARK OFFICE
CERTIFICATE OF CORRECTION

PATENT NO. : 7,279,971 B2  Page 1 of 1
APPLICATION NO. : 10/525957
DATED : October 9, 2007
INVENTOR(S) : Hellberg et al.

It is certified that error appears in the above-identified patent and that said Letters Patent is hereby corrected as shown below:

In Column 1, Line 7, after "2002" insert -- . --.

In Column 3, Line 16, delete "P11, P12 and P21, P22" and insert -- PA11, PA12 and PA21, PA22 --, therefor.

In Column 4, Line 66, after "of 0.4" delete "(pair P11, P12)" and insert -- (pair PA11, PA12) --, therefor.

In Column 4, Line 66, after "and 0.6" delete "(pair P21. P22)" and insert -- (pair PA21, PA22) --, therefor.

In Column 5, Line 1, delete "P11, P12" and insert -- PA11, PA12 --, therefor.

In Column 6, Line 42, delete "Com" and insert -- COM --, therefor.

In Column 6, Line 52, delete "WO01/91282 A2" and insert -- [6] WO01/91282 A2. --, therefor.

In Column 6, Line 58, in Claim 1, after "comprising" insert -- : --.

In Column 7, Line 33, in Claim 10, after "comprising" insert -- : --.

In Column 7, Line 36, in Claim 10, after "amplifier" insert -- ; --.

Signed and Sealed this

Twenty-third Day of December, 2008

JON W. DUDAS
*Director of the United States Patent and Trademark Office*